Jan. 31, 1950 D. MACKEY 2,496,058

PERMEABILITY TUNER

Filed May 22, 1948

Inventor

Donald Mackey

By Philip G. Cooper

Attorney

Patented Jan. 31, 1950 2,496,058

UNITED STATES PATENT OFFICE 2,496,058

PERMEABILITY TUNER

Donald Mackey, Haddon Heights, N. J., assignor to Radio Corporation of America, a corporation of Delaware Application May 22, 1948, Serial No. 28,677

9 Claims. (Cl. 250—40)

This invention relates to variable permeability tuning apparatus, and more particularly to a permeability tuner for a superheterodyne radio receiver.

A superheterodyne radio receiver conventionally includes a signal frequency circuit and a tank circuit for the local oscillator both of which must be tuned through predetermined frequency ranges. In order to receive broadcast signals, the signal frequency circuit must be tuned from 530 kilocycles (kc.) to 1600 kc. The desired intermediate frequency usually amounts to 455 kc., and since the oscillator frequency is conventionally above the signal frequency, the oscillator tank circuit must be tuned approximately from 1,000 to 2,000 kc. Accordingly, the signal frequency circuit must be tuned over a frequency range varying approximately between a ratio of 1 to 3 while the oscillator tank circuit is tuned over a frequency range varying only between a ratio of 1 to 2. Furthermore, it is necessary that the frequency difference between the resonant frequencies of the two circuits remains constant throughout the entire frequency range and equals the intermediate frequency.

The problem of providing tracking between two resonant circuits is not new in the art and many solutions have been suggested. In a permeability tuner, for example, the resonant frequency of a circuit is changed by varying the relative position of a paramagnetic core with respect to its coil, thereby to vary the inductance of the circuit. Since the oscillator tank circuit is tuned through a smaller frequency range than the signal frequency circuit, the desired result is obtained by providing a smaller mutual coupling between the core and coil of the oscillator circuit than that between the core and coil of the signal frequency circuit. It is therefore conventional practice to wind the oscillator tank coil on a coil form having a larger outside diameter than that of the signal frequency coil. When the cores of the two such coils have equal diameters, the oscillator tank circuit is tuned through a smaller frequency range than the signal frequency circuit for equal movements of the two cores.

It is usually desired to provide a frequency dial for the receiver having substantially uniform calibrations. This may be effected by winding the signal frequency coil in such a manner that a straight line frequency tuning curve is obtained when the resonant frequencies of the oscillator tank circuit and of the signal frequency circuit are varied. In order to obtain the proper tracking, the oscillator tank coil is wound in accordance with conventional practice with a non-uniform pitch, while the signal frequency coil has a uniform pitch. In that case, the winding density of the oscillator tank coil is larger at that end of the coil where the core enters the coil, that is, when the circuit is tuned to the high frequency end of the tuning range. The winding density of a coil is determined by the number of turns per unit of length which in turn is given by the pitch of the winding and by the number of layers of the winding.

However, a permeability tuner where the signal frequency coil and the oscillator tank coil have different coil forms is not adapted for mass production methods. It has also been suggested to make one of the cores of the two circuits of a tapered form. This arrangement, however, has the disadvantage that the taper of the core is difficult to determine. Furthermore, tapered cores are hard to manufacture, and the die for the core is very expensive.

It is, accordingly, the principal object of the present invention to provide a novel permeability tuner for a superheterodyne radio receiver wherein two resonant circuits are tunable through predetermined frequency ranges so as to provide a substantially constant frequency difference between the resonant frequencies of the circuits.

A further object of the invention is to provide an improved permeability tuner of the character referred to having a substantially straight line frequency tuning curve which is adapted for mass production methods.

Another object of the invention is to provide, in a permeability tuning apparatus, a signal frequency coil and an oscillator tank coil which are both wound on identical coil forms and have paramagnetic cores of different cross sections designed in such a manner as to obtain proper tracking.

A superheterodyne radio receiver conventionally includes a signal frequency circuit and an oscillator tank circuit, each circuit having an inductance coil. In accordance with the present invention the signal frequency coil preferably is wound with a multilayer winding of variable pitch while the oscillator tank coil is wound with a single layer winding of variable pitch. The inner diameters of the two windings are equal. There is further provided a paramagnetic core for each of the two coils. The cores have different cross sections designed in such a manner that the mutual coupling between the signal frequency coil and its core is larger than that between the oscillator tank coil and its core. In this manner, proper tracking of the two circuits is provided when the cores are moved in unison relatively to their associated coils. Preferably, the core of the signal frequency coil has a circular cross section while the core of the oscillator tank coil has a rectangular or square cross section. The square core is preferably provided with rounded corners so that the core may be guided by the coil form.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which;

Figure 1:
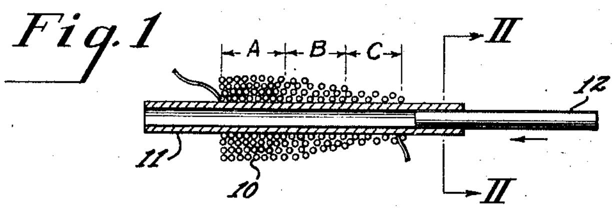
Fig. 1 is a cross-sectional view of a signal frequency coil and its associated paramagnetic core forming part of a permeability tuner in accordance with the invention.
Figure 2:
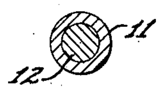
Fig. 2 is a cross-sectional view taken on line II—II of Fig. 1 and illustrating the core and coil form.
Figure 8:
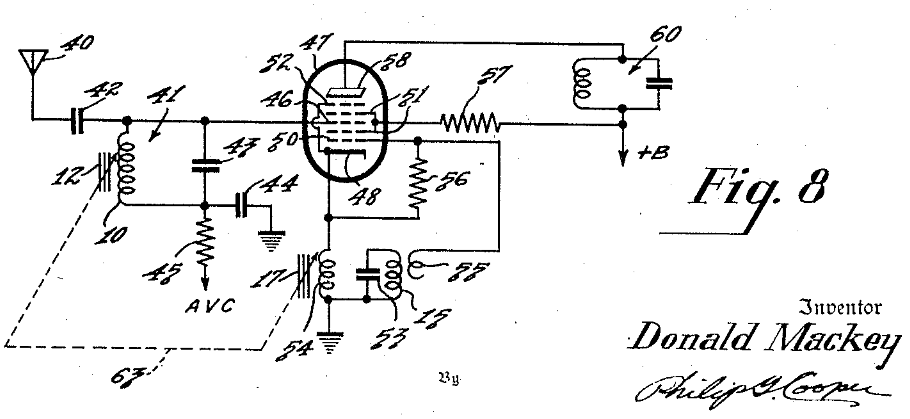
Fig. 8 is a circuit diagram of the pretuner and frequency converter of a superheterodyne receiver embodying the present invention.

Referring now to the drawing and particularly to Figs. 1 and 2, there is illustrated a signal frequency coil forming part of a resonant circuit which may be tuned by moving a paramagnetic core relatively thereto. A paramagnetic material is defined as a material having a magnetic permeability greater than that of a vacuum, which is unity. The magnetic permeability of a paramagnetic material may be independent of the magnetizing force or it may vary with the magnetizing force, in which case, the material is called ferromagnetic. Inductance coil 10 of Fig. 1 forms part of the permeability tuner of the invention illustrated in Figs. 5 and 6 while Fig. 8 is a circuit diagram of a superheterodyne receiver utilizing coil 10.

Inductance coil 10 is wound on cylindrical coil form 11 which may be made of a suitable insulating material such as Bakelite. As shown schematically in Fig. 1, inductance coil 10 consists of a multi-pitch progressive universal winding, that is, a multilayer winding having a non-uniform pitch. In order to facilitate winding of inductance coil 10, the winding may consist of three sections A, B and C of different pitch but the pitch of each section may be uniform. Thus, by way of example, coil sections A, B, C may be wound respectively with 306, 190 and 133.3 turns per inch, the total number of turns in each section being 122, 71 and 68. Inductance coil 10 may be wound with a litz wire of six strands of .0025" diameter, and coil form 11 may have an outer diameter of .228". The inner diameter of coil form 11 may be .205". The total pitch length of inductance coil 10 may amount to 1.284".

For the purpose of varying the inductance of coil 10, there is provided paramagnetic core 12 which may consist, for example, of finely divided electrolytic iron. Alternatively, core 12 may consist of any other suitable paramagnetic material such as ferrite which has a high magnetic permeability. Core 12 is of circular cross section as shown in Fig. 2 and may have a diameter of .196" and a length of 1⅜". The core 12 slides within coil form 11 and is guided thereby.

Figure 3:
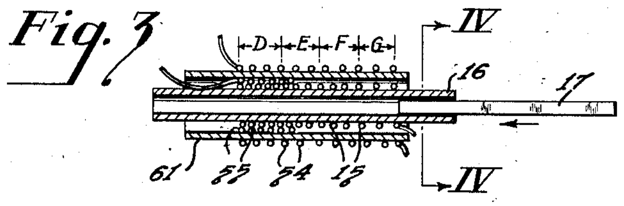
Fig. 3 is a cross-sectional view of an oscillator tank coil and its associated paramagnetic core forming part of the permeability tuner of the invention.
Figure 4:
Fig. 4 is a cross-sectional view taken on line IV—IV of Fig. 3 and illustrating the square core and coil form of Fig. 3.

Referring now to Figs. 3 and 4, there is illustrated oscillator tank coil 15 which may be wound on coil form 16 which has the same inner and outer diameter as coil form 11. Inductance coil 15 consists of a single layer winding of variable pitch. Prefereably coil 15 consists of four sections D, E, F and G, each section having a uniform pitch. The pitches of the four coil sections D, E, F and G, however, differ from each other. Thus, sections D, E, F and G may, for example, be wound with 183, 149, 114 and 106 turns per inch respectively, the total number of turns for each section being 65, 53, 28 and 26.5. Coil 15 is preferably wound with a wire having a diameter of .005".

Paramagnetic core 17 is arranged to move within coil form 16. Core 17 may consist of a mixture of equal parts by weight of iron carbonyl E and iron carbonyl TH. Iron carbonyl may be obtained by reducing iron oxide with carbon monoxide. Accordingly, core 17 has a smaller magnetic permeability than core 12. Cores 12 and 17 preferably are molded by side pressure molding. A core of substantially square cross section such as core 17 lends itself particularly well to side pressure molding as does round core 12. As clearly shown in Fig. 4, core 17 has a substantially square cross section with rounded corners indicated at 18, although core 17 may also be of rectangular cross section. Core 17 may have the same length as core 12, that is, 1⅜" and the distance between opposite faces of the core may be .156". Corners 18 may be broached to a radius of approximately .1". The dimensions of core 17 are accordingly such as to afford a sliding fit within coil form 16. Cores 12 and 17 are accordingly guided and supported by their respective coil forms 11 and 16.

In Figs. 1 and 3 cores 12 and 17 have been shown substantially withdrawn from coils 10 and 15 respectively. If a condenser is connected across each coil 10 and 15, the resonant circuits would be resonant at the high frequency ends of their frequency ranges. It will be readily seen from an inspection of Figs. 1 and 3 that the winding density of coils 10 and 15 is less at that end of each coil where its core enters the coil.

Figure 7:
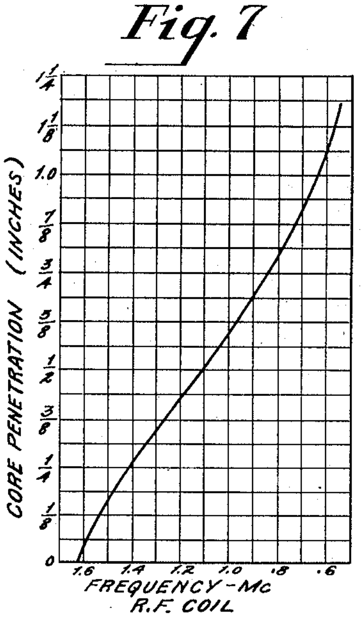
Fig. 7 is a graph showing the relationship between the core penetration and the resonant frequency of the signal frequency circuit of the permeability tuner.

The change in inductance of a coil which is caused by movement of a paramagnetic core with respect to the coil is dependent upon the magnetic coupling between the core and the coil. Thus, when the core enters the coil, the inductance of each turn of the winding is varied. Furthermore, the coupling between adjacent turns is increased. It will therefore be appreciated that the change in inductance caused by movement of a core with respect to its coil depends not only on the mutual coupling between the core and the coil but also on the winding density. These relations must be borne in mind when a permeability tuner is designed to obtain proper tracking. Coil 10, for example, is designed in such a manner that a substantially straight line frequency tuning curve is obtained, the tuning curve being shown in Fig. 7. It will be seen that as the core penetrates coil 10, the inductance of the coil is increased and the resonant frequency of the signal frequency circuit is decreased according to an approximately straight curve.

Figure 5:
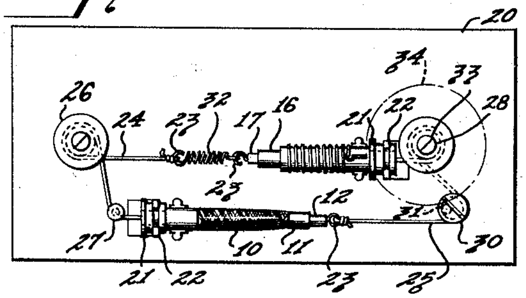
Fig. 5 is a plan view of the permeability tuner of the invention.
Figure 6:
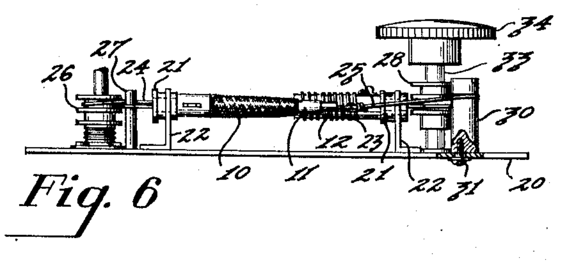
Fig. 6 is a side elevational view of the tuner of Fig. 5.

Referring now to Figs. 5 and 6 there is illustrated a permeability tuner embodying the present invention and including inductance coils 10 and 15. Coil forms 11 and 16 are fixedly mounted on chassis plate 20 by means of rubber grommets 21 which are supported by brackets 22. Cores 12 and 17 are provided on both ends with a hook 23 and the two cores are interconnected by cables 24 and 25. Cable 24 is guided by idler pulley 26 and fixed stud 27 while cable 25 is guided by pulley 28 and stud 30. Stud 30 may be eccentrically mounted by screw 31 on chassis plate 20 for adjusting the relative positions of cores 12 and 17 in the manner disclosed and claimed in the co-pending application to W. W. Dewhurst filed on April 30, 1948, Serial No. 24,393. By rotating eccentric stud 30, core 12 is moved into or out of coil form 11 against the action of take-up spring 32 provided between core 17 and cable 24. Pulley 28 is secured to drive shaft 33 which may be actuated by tuning control knob 34 (Fig. 6). When tuning control knob 34 is rotated, both cores 12 and 17 will be moved in unison with respect to their fixed coils to effect tuning of the receiver.

Inductance coils 10 and 15 may be used in the receiver circuit illustrated in Fig. 8. The receiver includes antenna 40 for intercepting a modulated carrier wave which is impressed on signal frequency circuit 41 through coupling condenser 42. Signal frequency circuit 41 may consist of coil 10 of Fig. 1 across which is connected condenser 43. Signal frequency circuit 41 may be tuned by core 12 illustrated schematically.

The low potential terminal of signal frequency circuit 41 is grounded for radio frequency currents by bypass condenser 44 and is connected through resistor 45 to a suitable source of automatic volume control voltage (AVC) in accordance with conventional practice. The high potential terminal of signal frequency circuit 41 is connected to control grid 46 of converter tube 47. Converter tube 47 which is preferably a pentagrid converter includes cathode 48, control grid 50, two screen grids 51, suppressor grid 52 tied to cathode 48 and anode 58.

The oscillator section of the frequency converter is coupled to control grid 50 and cathode 48 and comprises oscillator tank coil 15 which may be identical with the coil illustrated in Fig. 3. Tank coil 15 is tuned by condenser 53. Oscillator feedback or tickler coil 54 is connected between cathode 48 and resonant circuit 15, 53, the junction point of coils 54 and 15 being grounded. Control grid 50 is coupled to the oscillator tank circuit by winding 55 which represents a capacitive coupling between the upper terminal of the tank circuit and control grid 50. Grid leak resistor 56 is connected between control grid 50 and cathode 48.

The oscillator section is arranged as a Hartley oscillator. Coils 15 and 54 may be considered as one coil having an intermediate point grounded. Winding 55 provides a capacitive coupling between the upper terminal of tank circuit 15, 53 and control grid 50. Screen grids 51 are connected to a suitable positive voltage supply +B through dropping resistor 57 while anode 58 of converter 47 is connected to the voltage supply +B through anode tank circuit 60 from which the intermediate frequency signal may be derived.

An inspection of Fig. 8 shows that the oscillator section of the frequency converter comprises three coils 15, 54 and 55. As illustrated in Fig. 3, the three coils are preferably wound on top of each other. Thus, winding 55 may be wound over tank coil 15 and may consist of 35 turns of closely wound wire of .004" diameter. Tickler coil 54 preferably is wound on a separate coil form 61 which snugly fits over winding 55. Tickler coil 54 may consist of a single layer winding of 16 turns of a wire of .0063" diameter wound with a pitch of 12.8 turns per inch.

The receiver illustrated in Fig. 8 is tuned by moving cores 12 and 17 in unison as indicated schematically at 63. The construction of oscillator tank coil 15 as illustrated in Fig. 3 makes it possible to use a lower ratio of inductance over capacitance for the oscillator tank circuit 15, 53. This, in turn, will render the oscillator more stable regardless of changes in humidity.

There has thus been described a permeability tuner which is inexpensive to manufacture and by means of which accurate tracking may be obtained. Since both the signal frequency coil and the oscillator tank coil are wound on identical coil forms, their manufacture is facilitated. Furthermore, cores 12 and 17 may be molded by side pressure molding to facilitate their manufacture.

What is claimed is:

1. In a superheterodyne radio receiver, a signal frequency circuit including a first inductance coil, an oscillator tank circuit including a second inductance coil, said first coil being wound with a multilayer winding of variable pitch, said second coil being wound with a single layer winding of variable pitch and having the same inner diameter as said multilayer winding, a first paramagnetic core for said first coil, and a second paramagnetic core for said second coil, said cores having different cross sections designed in such a manner that the mutual coupling between said first core and said first coil is larger than that between said second core and said second coil to provide tracking of said circuits when said cores are moved in unison relatively to their associated coils.

2. In a superheterodyne radio receive, a signal frequency circuit including a first inductance coil, an oscillator tank circuit including a second inductance coil, said first coil being wound with a multilayer winding of variable pitch, said second coil being wound with a single layer winding of variable pitch and having the same inner diameter as said multilayer winding, a first paramagnetic core for said first coil, and a second paramagnetic core for said second coil, said cores having different cross sections which are identical throughout the length of each core and designed in such a manner that the mutual coupling between said first core and said first coil is larger than that between said second core and said second coil to provide tracking of said circuits when said cores are moved in unison relatively to their associated coils.

3. In a superheterodyne radio receiver, a permeability tuner comprising a signal frequency circuit, an oscillator tank circuit, each of said circuits including an inductance coil, a first paramagnetic core for one of said coils having a circular cross section, a second paramagnetic core for the other one of said coils having a substantially flat face parallel to its longitudinal axis, a common drive for moving said cores in unison to tune said circuits throughout a predetermined frequency range, said coils consisting each of a winding of non-uniform pitch and equal inner diameter arranged in such a manner that the winding density is less at that end of each coil where its associated core enters the coil, thereby to provide a substantially constant frequency difference between the resonant frequencies of said circuits.

4. In a superheterodyne radio receiver, a permeability tuner comprising a signal frequency circuit, an oscillator tank circuit, each of said circuits including an inductance coil, coil forms of like diametrical dimensions for said coils, a first paramagnetic core for one of said coils having a circular cross section, a second paramagnetic core for the other one of said coils having a substantially rectangular cross section, a common drive for moving said cores in unison to tune said circuits throughout a predetermined frequency range, thereby to provide a substantially constant frequency difference between the resonant frequencies of said circuits.

5. In a superheterodyne radio receiver, a permeability turner comprising a signal frequency circuit, an oscillator tank circuit, each of said circuits including an inductance coil, coil forms of equal outer and inner diameters for said coils, a first paramagnetic core for one of said coils having a circular cross section, a second paramagnetic core for the other one of said coils having a substantially square cross section with round corners designed to have a sliding fit within one of said coil forms, a common drive for moving said cores in unison to tune said circuits throughout a predetermined frequency range, thereby to provide a substantially constant frequency difference between the resonant frequencies of said circuits.

6. In a superheterodyne radio receiver, a permeability tuner comprising a signal frequency circuit, an oscillator tank circuit, each of said circuits including an inductance coil, identical coil forms for said coils, a first paramagnetic core for one of said coils having a circular cross section, a second paramagnetic core for the other one of said coils having a substantially square cross section with rounded corners designed to afford a sliding fit within one of said coil forms, a common drive for moving said cores in unison to tune said circuits throughout a predetermined frequency range, said coils having windings of non-uniform pitch and of less winding density at the core entering portion, thereby to provide a substantially constant frequency difference between the resonant frequencies of said circuits, the pitch of said signal frequency coil being such that a substantially straight line frequency tuning curve is obtained.

7. In a superheterodyne radio receiver, a permeability tuner comprising a signal frequency circuit including a first coil, an oscillator tank circuit including a second coil, a first paramagnetic core of circular cross section for said first coil, a second paramagnetic core having a substantially flat face parallel to its longitudinal axis for said second coil, and a common drive for moving said cores in unison with respect to their coils to tune said circuit through a predetermined frequency range, said coils consisting each of a winding of non-uniform pitch and equal inner diameter arranged in such a manner that the winding density is less at that end of each coil where its associated core enters the coil, the pitch of said first coil winding being such that a substantially straight line frequency tuning curve is obtained.

8. In a superheterodyne radio receiver, a permeability tuner comprising a signal frequency circuit including a first coil, an oscillator tank circuit including a second coil, coil forms of equal outer diameter for said coils, a first paramagnetic core of circular cross section for said first coil, a second paramagnetic core of substantially rectangular cross section for said second coil, and a common drive for moving said cores in unison with respect to their coils to tune said circuits through a predetermined frequency range, said coils consisting each of a winding of non-uniform pitch arranged in such a manner that the winding density is less at that end of each coil where its associated core enters the coil, the pitch of said first coil winding being such that a substantially straight line frequency tuning curve is obtained.

9. In a superheterodyne radio receiver, a permeability tuner comprising a signal frequency circuit including a first coil, an oscillator tank circuit including a second coil, coil forms of equal inner and outer diameters for said coils, a first paramagnetic core of circular cross section for said first coil, a second paramagnetic core of different permeability than said first core and of substantially square cross section for said second coil, said cores being designed to slide in said coil forms, and a common drive for moving said cores in unison with respect to their coils to tune said circuits through a predetermined frequency range, said coils consisting each of a winding of non-uniform pitch arranged in such a manner that the winding density is less at that end of each coil where its associated core enters the coil, the pitch of said first coil winding being such that a substantially straight line frequency tuning curve is obtained.

DONALD MACKEY.

REFERENCES CITED

The following references are of record in the file of this patent:

UNITED STATES PATENTS

| Number | Name | Date |
|---|---|---|
| 2,190,048 | Sinninger | Feb. 13, 1940 |
| 2,252,092 | Newman | Aug. 12, 1941 |
| 2,363,101 | Van Der Heem | Nov. 21, 1944 |

OTHER REFERENCES

Tele-Tech for March 1947, print in 250—20—331, pages 48 to 51 inc. Article by Harry E. Fairman.